United States Patent [19]

Ogawa

[11] Patent Number: 5,917,333
[45] Date of Patent: Jun. 29, 1999

[54] SEMICONDUCTOR INTEGRATED CIRCUIT DEVICE WITH DIAGNOSTIC CIRCUIT USING RESISTOR

[75] Inventor: Hisao Ogawa, Tokyo, Japan

[73] Assignee: NEC Corporation, Tokyo, Japan

[21] Appl. No.: 08/788,444

[22] Filed: Jan. 28, 1997

[30] Foreign Application Priority Data

Mar. 15, 1996 [JP] Japan ..................................... 8-087201

[51] Int. Cl.⁶ ................................................. G01R 31/26
[52] U.S. Cl. ............................................ 324/769; 324/765
[58] Field of Search ..................................... 324/765, 766, 324/769

[56] References Cited

U.S. PATENT DOCUMENTS

| | | | |
|---|---|---|---|
| 4,849,847 | 7/1989 | McIver et al. | 361/88 |
| 4,958,123 | 9/1990 | Hughes | 323/316 |
| 5,332,973 | 7/1994 | Brown et al. | 324/537 |
| 5,517,107 | 5/1996 | Ovens et al. | 324/158.1 |

FOREIGN PATENT DOCUMENTS

| | | |
|---|---|---|
| 61-46613 | 3/1986 | Japan . |
| 62-274635 | 11/1987 | Japan . |
| 2-140947 | 5/1990 | Japan . |
| 794683 | 4/1995 | Japan . |

*Primary Examiner*—Glenn W. Brown
*Attorney, Agent, or Firm*—Whitham, Curtis & Whitham

[57] ABSTRACT

In a semiconductor integrated circuit device, a signal processing circuit includes an output control circuit and an output circuit and is composed of a plurality of MOS transistors. The signal processing circuit inputs a circuit signal and processes the circuit signal. A diagnostic circuit includes at least a diagnostic resistor indicative of a gate length of each of the plurality of MOS transistors and generates a diagnosis signal based on a resistance value of the diagnostic resistor. The output control circuit controls the output circuit to one of an output enable state and an output disable state based on the diagnosis signal.

20 Claims, 9 Drawing Sheets

SEMICONDUCTOR INTEGRATED CIRCUIT DEVICE WITH DIAGNOSTIC CIRCUIT USING RESISTOR

BACKGROUND OF THE INVENTION

1. Field of the Invention

The present invention relates to a semiconductor integrated circuit device, and more particularly to a semiconductor integrated circuit device which has a self-diagnosis function to determine for every chip whether or not the semiconductor integrated circuit device is good in performance.

2. Description of Related Art

In recent years, the high integration, high density and high performance of a semiconductor integrated circuit device proceed remarkably. For this reason, various problems occur in a manufacture process.

One of such problems is that the performance of the semiconductor integrated circuit device changes because of a distribution of characteristics of MOS transistors in the circuit device due to change of parameters in the manufacturing process. As a result, the performance of the circuit device becomes close to a performance limit, especially an operation speed limit of the circuit devices requested by customers. Therefore, there has increased the generation rate of the products which can operate but do not meet the required operation speed.

The performance distribution width of the circuit devices is possible to be reduced if manufacture standards in the wafer manufacturing process are made severe. In such a case, however, there is another problem in that it is difficult that all chips on the semiconductor wafer satisfy the manufacturing standards. For this reason, it is necessary to change the management in the manufacture of the semiconductor integrated circuit devices from the wafer-based management to the chip-based management. Thus, the need to determine whether the performance of every circuit device falls within the product standard has been increased.

Figure 1:
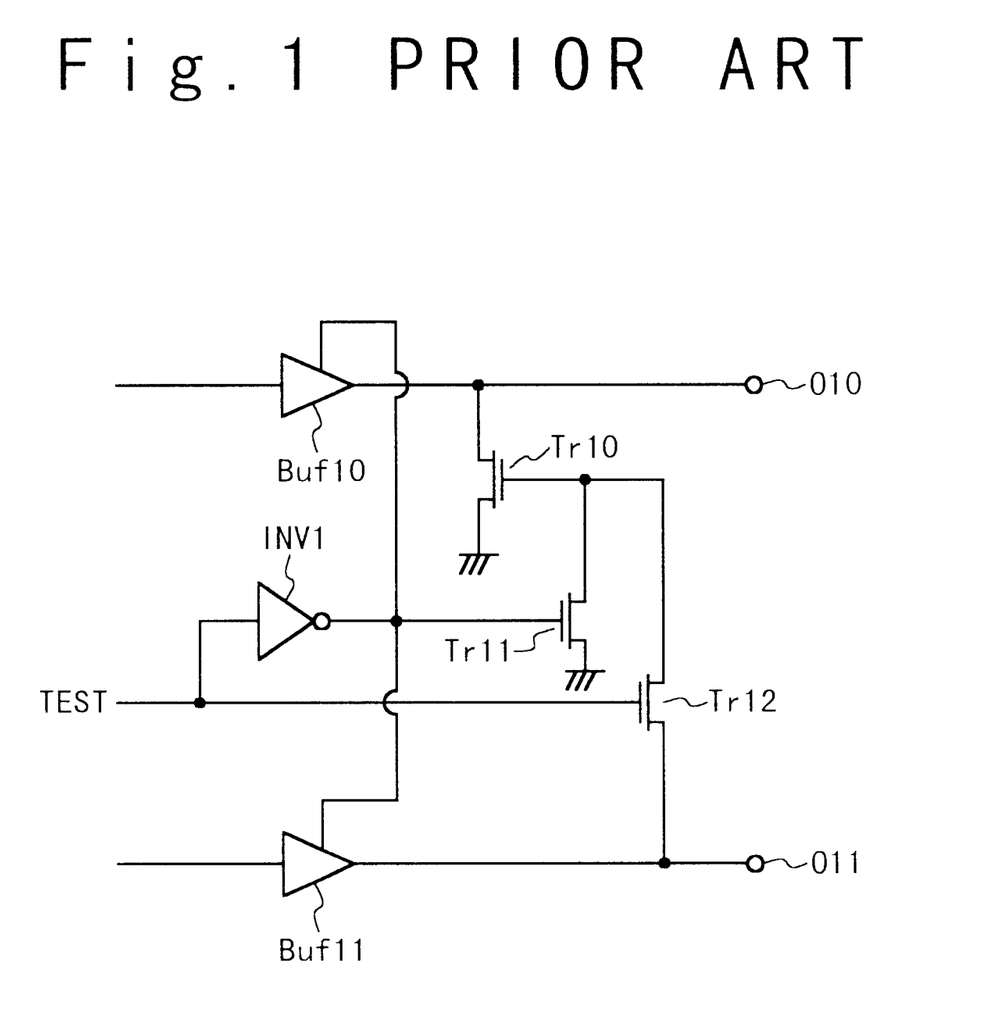
FIG. 1 is a circuit diagram illustrating a conventional semiconductor integrated circuit device.

A conventional semiconductor integrated circuit device having such a determining circuit is disclosed in Japanese Laid Open Patent Disclosure (JP-A-Showa 62-274635) as the first reference which corresponds to U.S. patent application Ser. No. 06/863,094 filed on May 14, 1986, now abandoned, or Japanese Laid Open Patent Disclosure (JP-A-Heisei 2-140947) as the second reference. The conventional semiconductor integrated circuit device of the second reference has a circuit structure shown in FIG. 1. Referring to FIG. 1, the conventional semiconductor integrated circuit device is composed of a transistor Tr10 as a test target which is connected between an external terminal O10 and a ground line, a transistor Tr12 which is connected between an external terminal O11 and the gate electrode of the transistor Tr10, and a transistor Tr11 which is connected between the gate electrode of the transistor Tr10 and the ground line. Either of the transistor Tr11 and the transistor Tr12 is turned on based on the state of a test signal TEST, i.e., whether the test signal TEST is "0" or "1".

In a case where the transistor Tr12 is turned on, a drain voltage and a gate voltage are supplied from the external terminals O10 and O11 to the drain and gate of the transistor Tr10, respectively. Thereby, the characteristic of the transistor Tr10 as the test target can be measured. On the other hand, in a case where the transistor Tr11 is turned on, the transistor Tr10 is turned off. In addition, an output buffer Buf10 and an output buffer Buf11 are activated. As a result, the output signals of these output buffers Buf10 and Buf11 are outputted to the external terminals O10 and O11, respectively.

There is the following problems in the conventional semiconductor integrated circuit device shown in FIG. 1. That is, the first problem is in that an additional external input terminal is required to externally input the test signal TEST to the conventional semiconductor integrated circuit device and to measure the transistor as the test target, as shown in FIG. 1. In the semiconductor integrated circuit device, the number of external terminals has increased more and more as the high integration and achievement of multi-functions. For this reason, it is necessary to avoid use of any external terminal even for measurement of a transistor characteristic.

Another problem of the conventional semiconductor integrated circuit device shown in FIG. 1 is in that special test facilities are required such as a digital signal source, an analog signal source and an analog tester to measure the characteristic of the transistor as the test target. Especially, in a case where an analog signal is inputted and measured, it is not easy to reduce noise generated from the test facilities in measurement. For this reason, there is caused a problem that the test facilities themselves must be made to have high precision, resulting in a high price of the test facilities. Also, as the high integration and achievement of multi-function of the semiconductor integrated circuit device, the test takes a long time. It derives increase in cost of the semiconductor integrated circuit device. Also, the measurement using the analog signal requires the long measurement time compared to the measurement using a digital signal. Therefore, the measurement using the analog signal should be avoided.

Figure 2:
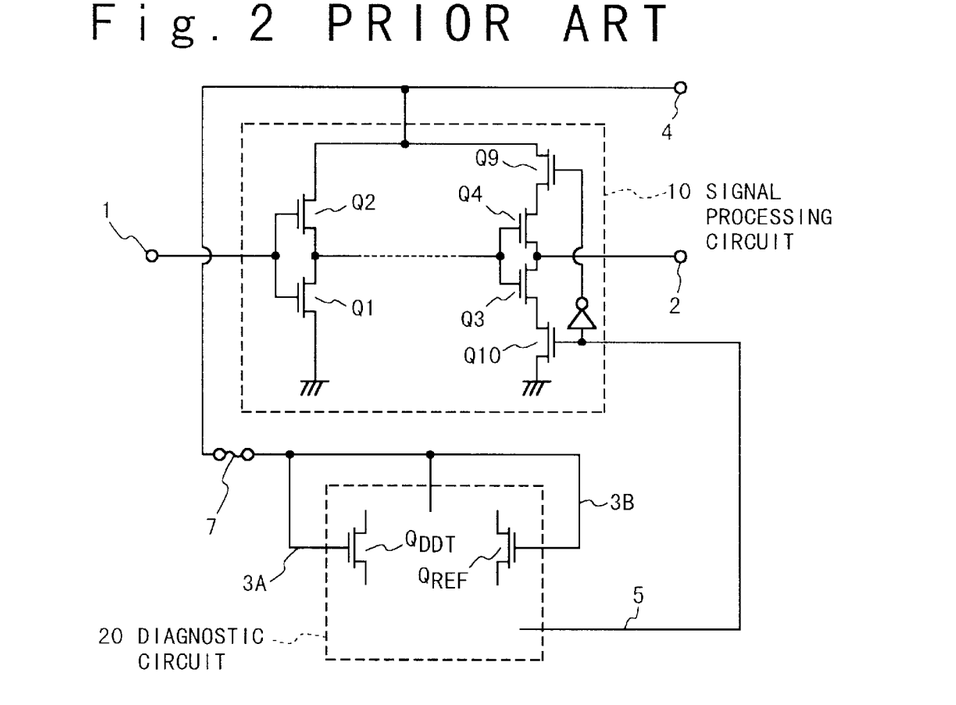
FIG. 2 is a circuit diagram illustrating another conventional semiconductor integrated circuit device.
Figure 3:
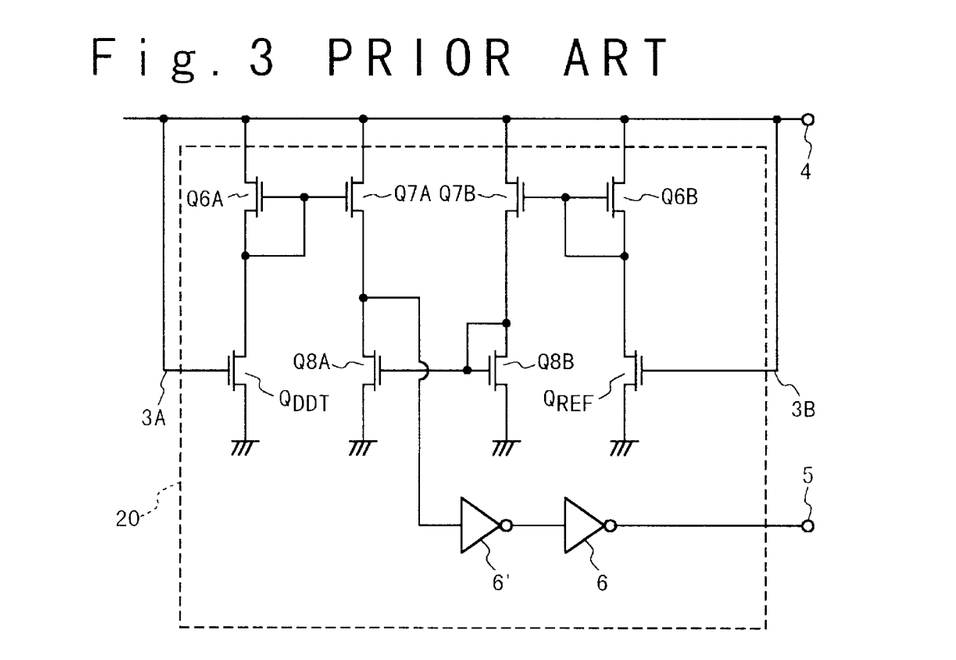
FIG. 3 is a circuit diagram illustrating the structure of a conventional diagnostic circuit shown in FIG. 2.

In order to solve the problems of the above semiconductor integrated circuit device, the inventor of the present invention proposed in Japanese Laid Open Patent Disclosure (JP-A-Heisei 7-94683: corresponding to Japanese Patent Application No. Heisei 5-239341) an improved semiconductor integrated circuit device whose circuit structure was shown in FIGS. 2 and 3. FIG. 2 is a block diagram illustrating the circuit structure of the proposed semiconductor integrated circuit device and FIG. 3 is a circuit diagram illustrating the circuit structure of a diagnostic circuit 20 in FIG. 2. The circuit structure is composed of means for self-diagnosing whether the performance of a semiconductor device falls within the manufacture standard for every chip, and means for determining whether or not the integrated circuit device is good, for every chip in accordance with a signal indicative of the diagnosis result.

Referring to FIG. 2, the conventional semiconductor integrated circuit device is composed of a signal processing circuit 10 and a diagnostic circuit 20. The signal processing circuit 10 is connected to an external input terminal 1 to which a predetermined logic input signal is inputted and an external output terminal 2 from which a logic signal obtained by processing the logic input signal is outputted. The diagnostic circuit 20 self-diagnoses whether each of transistors Q1, Q2, Q3 and Q4 of the signal processing circuit 10 is in a good performance state. The diagnostic circuit 20 is composed of a diagnostic transistor $Q_{DDT}$ having the same size as at least one of the transistors Q1 to Q4 and a reference transistor $Q_{REF}$ used as a reference in comparison of the performance. That the transistors have the same size means that the gate length and the gate width are the same at least between the transistors. Whether the characteristic of the transistor $Q_{DDT}$ is good is diagnosed by comparing the drain current of the diagnostic transistor $Q_{DDT}$ and the drain current of the reference transistor $Q_{REF}$.

Referring to FIG. 3, the diagnostic circuit 20 is composed of a comparing circuit to compare the characteristic of the reference transistor QREF and that of the diagnostic transistor QDDT which represents the transistors of the signal processing circuit 10. In a case where the characteristic of the diagnostic transistor QDDT is not in a range determined based on that of the reference transistor QREF, the diagnostic transistor QDDT is determined not to satisfy the manufacture standard. A signal is generated on an output terminal 5 in accordance with the determining result. The external output terminal 2 for the signal processing circuit 10 is set to either of the output enable state or the high impedance state based on this signal.

Referring to FIG. 3 again, in a usual comparing circuit, two transistors located on symmetric position are designed to have the same gate length and the same gate width. This is because the mutual conductances of these two transistors should be kept to be same, so that the symmetry of the circuit should be kept, even If the gate length and gate width of the transistor are changed from the design values in the manufacturing process. In FIG. 3, for example, the transistor Q6A and the transistor Q6B are designed to have the same size. Similarly, the transistors Q7A and Q7B, the transistors Q8A and Q8B, and the transistors QDDT and QREF are also designed to have the same sizes, respectively. In this circuit structure, signals are inputted to the input terminal 3A and 3B respectively and compared with each other. A logic signal of "1" or "0" is outputted to the external output terminal 5 (the output terminal of Inverter 6) in accordance with the comparing result.

The comparing circuit used for this conventional semiconductor integrated circuit device is designed to detect the difference in drain current between the two transistors QDDT and QREF, unlike a usual method of comparing the amplitudes of two input signals, to be mentioned later. Therefore, a common potential is given to two input terminals 3A and 3B. That is, the gate electrode of each of the transistors QDDT and QREF is connected to a higher potential power supply line 4. The drain current IREF of the reference transistor QREF is folded back by the first current mirror circuit which is composed of transistors Q6B and Q7B and is inputted to the input terminal (the drain of the transistor Q8B) of the second current mirror circuit which is composed of the transistors Q8A and Q8B. On the other hand, the drain current IDDT of the diagnostic transistor QDDT is folded back by the third current mirror circuit which is composed of the transistors Q6A and Q7A. The inverter 6' which is connected to the connection node between the output terminals (the drains of the transistors Q7A and Q8A) of the second and third current mirror circuits, logically inverts a voltage signal corresponding to the difference between the currents IDDT and IREF and outputs to the output terminal 5 as a binary logic signal through an inverter 6.

Note that two transistors QDDT and QREF are designed to have substantially the same mutual conductances, i.e., the same ratio (W/L) of the gate width (W) to the gate length (L). However, the absolute values of the gate width and gate length of the transistor QREF are much larger than those of the transistor QDDT. On the other hand, the gate width and gate length of the transistor QDDT are the same in size as those of either of the MOS transistors Q1, Q2, Q3 and Q4 which are used in the signal processing circuit 10. This is because the reference transistor QREF keeps a predetermined mutual conductance as a comparison reference without undergoing any influence even if the gate width and gate length of each of the transistors are changed from the design values due to deviations of parameters in the wafer manufacturing process, to be mentioned later.

The Japanese Laid Open Patent Disclosure (JP-A-Showa 61-46613) discloses a level detecting circuit in which a detection level does not change even if a threshold voltage of a MOS-FET changes, but a stabilized voltage and a signal voltage to be tested are supplie d to MOS transistors of a comparing circuit, respectively, unlike the second reference.

Figure 4:
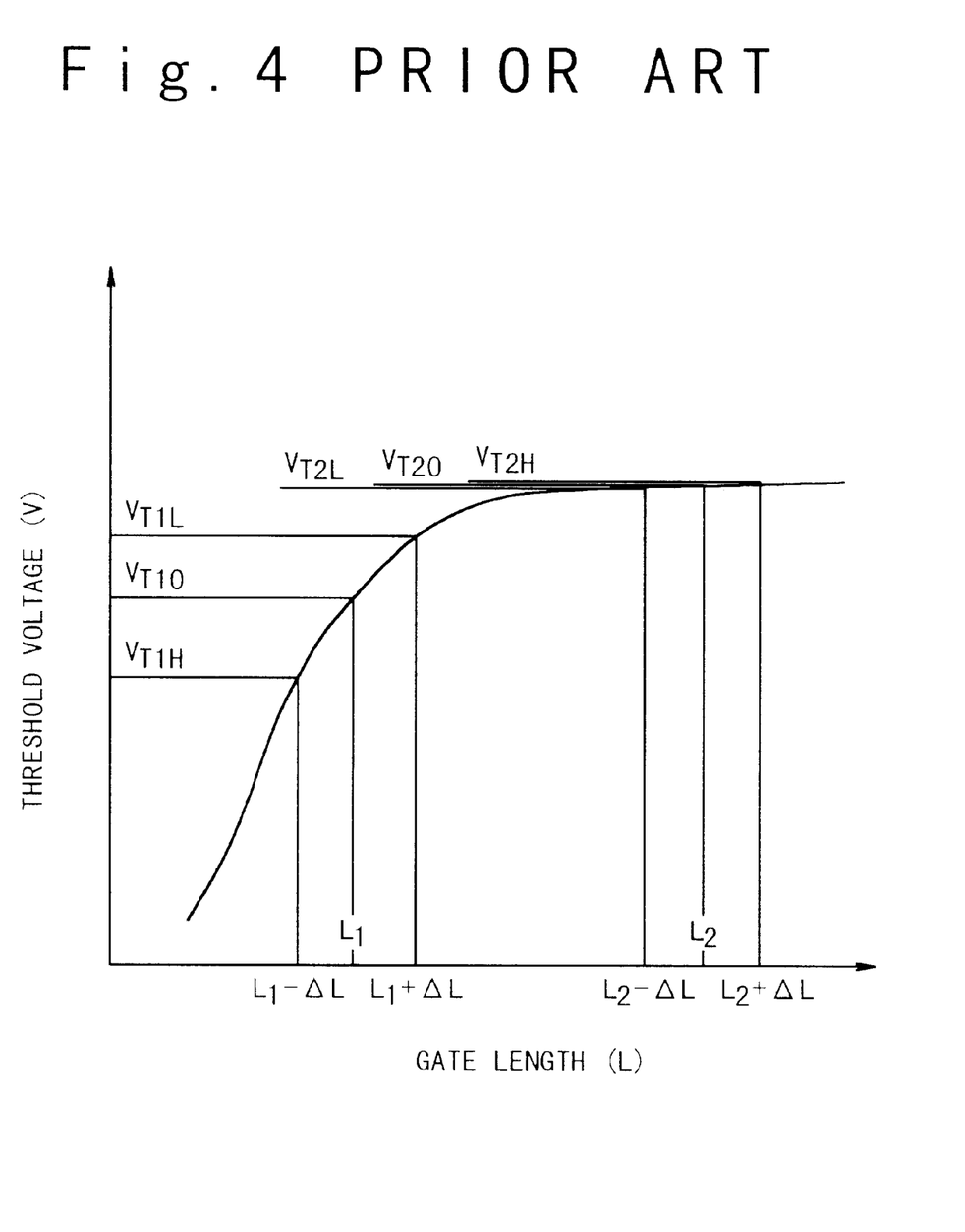
FIG. 4 is a graph illustrating a relation of threshold voltage and gate length in a MOS transistor.

The operation of the conventional semiconductor integrated circuit device of the second reference shown In FIG. 2 will be described below, in conjunction with the method of diagnosing whether the transistor characteristic is good, taking as an example the case where the gate length of the transistor becomes shorter than the design value in the wafer manufacturing process so that the performance of the transistor is changed from the design performance values. FIG. 4 is a graph illustrating a relation of threshold voltage and the gate length of the MOS transistor. In FIG. 4, the gate length L1 is the design gate lengths of each of the MOS transistors in the signal processing circuit 10 and the diagnostic transistor QDDT in the diagnostic circuit 20 and it is, for example, 0.5 μm. The gate length L2 is the gate length of the reference transistor QREF and it is, for example, 5 μm. ΔL indicates the permissive width against deviation generated in the wafer manufacturing process and it is, for example, 0.05 μm. In a case where the threshold voltage VT10 corresponding to the gate length L1 is, for example, 0.6 V when the gate length is L1, the threshold voltage values VT1L, VT1H, VT2L, VT20 and VT2H corresponding to the gate lengths L1−ΔL, L1+ΔL, L2−ΔL, L2 and L2+ΔL are 0.45 V, 0.7 V, 0.895 V, 0.90 V and 0.905 V, respectively. In this case, if the power supply voltage is 3.3 V, a distribution width of mutual conductance indicative of the transistor performance is in a range from +24% to −16% with respect to the design mutual conductance of the transistor with the gate length of L1. On the other hand, the distribution width of mutual conductance is in a range of ±1.5% with respect to the design mutual conductance of the transistor with the gate length of L2.

In the MOS transistor, because the leak current increases and the element lifetime becomes short if the gate length becomes short. Therefore, the lower limit of the gate length needs to be set from the viewpoint of prevention of malfunction and performance guarantee. In this example, the lower limit value is preferably 0.45 μm, and more preferably 0.47 μm. On the other hand, when the gate length becomes long, there is a problem that the operation speed of the circuit is decreased. Therefore, the upper limit value is preferably 0.55 μm, and more preferably 0.53 μm. Thus, the manufacturing process of the semiconductor integrated circuit device needs to be managed based on these upper and lower limit values. In this conventional example, the threshold voltage of the MOS transistor changes as change of the gate length. The deviation of the gate length is detected using the fact that the change amount of the threshold voltage depends on the gate length, as shown in FIG. 4 and then whether the transistor characteristic is good or wrong is determined.

In the diagnostic circuit which is shown in FIG. 3, it is assumed that the lower limit value of the gate length of the transistor which has been designed with L1=0.5 μm is 0.45 μm. Also, the diagnostic transistor QDDT is designed to have the gate length of L1=0.50 μm and the gate width W1=5.0 μm, and the reference transistor QREF is designed to have the gate length of L2=5.0 μm and the gate width W2=77 μm. In this case, if there is no deviation in the transistor size in the manufacture process, the mutual conductance of the diagnostic transistor QDDT is smaller than the mutual conductance of the reference transistor QREF. As a result, the drain current $I_{REF}$ flowing through the reference transistor $Q_{REF}$ is about 1.24 times of the drain current $I_{DDT}$ flowing through the diagnostic transistor $Q_{DDT}$. A Logic output signal of "1" is outputted to the output terminal 5. In the circuit shown in FIG. 2, when the signal which has been outputted to the output terminal 5 of the diagnostic circuit 20 has a logic value of "1" which indicates that the characteristic of the diagnostic transistor $Q_{DDT}$ satisfies the manufacture standards, the transistors Q9 and Q10 which compose a tri-state buffer of an output stage are set to the ON state. That is, this tri-state buffer of the output stage is activated such that the output signal determined in accordance with the input signal inputted to the input terminal 1 appears at the external output terminal 2.

On the other hand, when the parameters are changed during the wafer process so that the gate length of the diagnostic transistor $Q_{DDT}$ becomes 0.45 μm and the gate length of the reference transistor $Q_{REF}$ becomes 4.95 μm, the mutual conductances of the two transistors $Q_{DDT}$ and $Q_{REF}$ become same. If the gate lengths become further short, the magnitude relation in mutual conductance between the two transistors $Q_{DDT}$ and $Q_{REF}$ is made inverted. As a result, the mutual conductance of the diagnostic transistor $Q_{DDT}$ becomes larger than the mutual conductance of the reference transistor $Q_{REF}$. In this case, the logic output signal on the output terminal 5 of the diagnostic circuit 20 is changed from "1" to "0" so that both of the transistors Q9 and Q10 which compose the tri-state buffer of the output stage are set to the OFF state. For this reason, the external output terminal 2 is set to the high impedance state. Therefore, an output from the external output terminal 2 is inhibited.

As would be understood from the above description of the operation, in the semiconductor integrated circuit device shown in FIG. 2, because the diagnostic circuit 20 self-diagnoses the characteristic of the MOS transistor used in the signal processing circuit 10, it is not necessary to externally input any dedicated signal to operate the diagnostic circuit 20, e.g., the signal TEST in the conventional integrated circuit device shown in FIG. 1. Also, a diagnosis result is represented as a binary signal of "1" or "0". This signal determines the output enable or disable state of the external output terminal 2 of the signal processing circuit 10.

However, the above-mentioned conventional semiconductor integrated circuit device has the following problem. That is, in the conventional semiconductor integrated circuit device shown in FIG. 2, the reference MOS-type field effect transistor $Q_{REF}$ is designed such that it is larger several times in the gate length and gate width than the diagnostic transistor $Q_{DDT}$. However, as shown in FIG. 4, since the threshold voltage of the transistor has dependency on the gate length, even if a ratio of the gate length to the gate width in the reference transistor $Q_{REF}$ is merely set to the same as that of the diagnostic transistor, the reference transistor $Q_{REF}$ cannot be obtained to have the same mutual conductance as the diagnostic transistor $Q_{DDT}$. Therefore, there is a problem that the circuit design to get a desired characteristic is not easy.

SUMMARY OF THE INVENTION

Therefore, the present invention is accomplished in the light of the above circumstances. An object of the present invention is to provide a semiconductor integrated circuit device in which the difficulty of circuit design is eliminated and which includes a diagnostic circuit for diagnosing whether a test target transistor can be good, based on manufacture standards for a manufacturing process.

In order to achieve an aspect of the present invention, a semiconductor integrated circuit device includes a signal processing circuit including an output control circuit, an output circuit, for inputting a circuit signal, and for processing the circuit signal, wherein the signal processing circuit includes a plurality of MOS transistors, the output circuit outputs the processed signal to an output terminal, and the output control circuit sets the output circuit to one of an output enable state and an output disable state based on a diagnosis signal, and a diagnostic circuit including at least a diagnostic resistor indicative of a gate length of each of the plurality of MOS transistors, for outputting the diagnosis signal to the signal processing circuit based on a resistance value of the diagnostic resistor.

In this case, the diagnostic resistor may have a width corresponding to the gate length of the each MOS transistor such that change of the diagnostic resistor in resistance value represents change of each MOS transistor in gate length. Alternatively, the diagnostic circuit may further include a reference resistor, and generates the diagnosis signal based on whether the diagnostic resistor has the resistance value larger than that of the reference resistor or whether the diagnostic resistor has the resistance value smaller than that of the reference resistor. In this case, the reference resistor has the width at least three time larger than the gate length of the each MOS transistor. An amount of deviation of the resistance value of the diagnostic resistor because of a manufacturing process is further larger than of an amount of deviation of the resistance value of the reference resistor because of the manufacturing process.

The diagnostic circuit may be composed of three current mirror circuits for comparing the resistance value of the diagnostic resistor and the resistance value of the reference resistor, and each of MOS transistors in the current mirror circuits has a gate length longer than 3.0 μm.

In order to achieve another aspect of the present invention, a semiconductor integrated circuit device includes a signal processing circuit including an output control circuit, an output circuit, for inputting a circuit signal, and for processing the circuit signal, wherein the signal processing circuit includes a plurality of MOS transistors, the output circuit outputs the processed signal to an output terminal, and the output control circuit sets the output circuit to one of an output enable state and an output disable state based on a determination signal, a first diagnostic circuit including at least a diagnostic resistor indicative of a gate length of each of the plurality of MOS transistors, for generating a first diagnosis signal based on a resistance value of the diagnostic resistor, a second diagnostic circuit including at least a diagnostic MOS transistor corresponding to each of the plurality of MOS transistors, for generating a second diagnosis signal based on a mutual conductance of the diagnostic MOS transistor, and a control signal circuit for generating the determination signal from the first and second diagnosis signals.

In order to achieve still another aspect of the present invention, a method of diagnosing a semiconductor integrated circuit device, comprising the steps of:

forming a diagnostic resistor and gate electrodes of a plurality of MOS transistors at a same time, the diagnostic resistor being indicative of a gate length of the gate electrodes of the plurality of MOS transistors;

generating a diagnosis signal based on a resistance value of the diagnostic resistor;

controlling an output of a signal processing circuit to one of an output enable state and an output disable state based on the diagnosis signal. dr

DESCRIPTION OF THE PREFERRED EMBODIMENTS

A semiconductor integrated circuit device of the present invention will be described below in detail with reference to the accompanying drawing.

Figure 5:
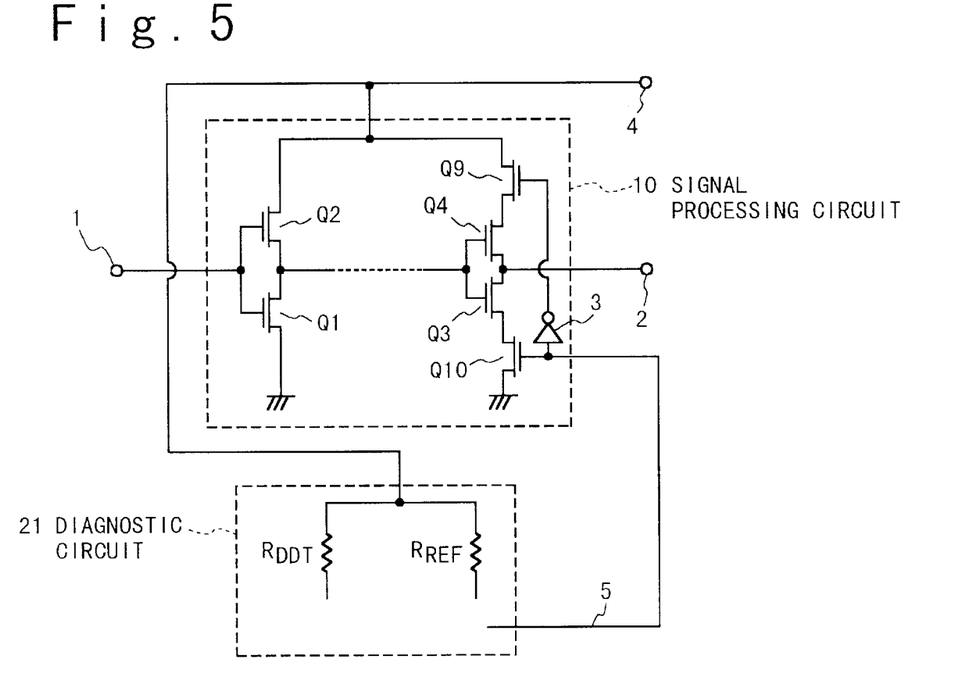
FIG. 5 is a circuit diagram illustrating a semiconductor integrated circuit device according to the first embodiment of the present invention.

FIG. 5 is a circuit diagram illustrating the semiconductor integrated circuit device according to the first embodiment of the present invention. Referring to FIG. 5, in the first embodiment, the semiconductor integrated circuit device is composed of a signal processing circuit 10 and a diagnostic circuit 21.

The signal processing circuit 10 is composed of an input circuit section composed of an N-channel MOS transistor Q1 and a P-channel MOS transistor Q2, an output circuit section composed of an N-channel MOS transistor Q3 and a P-channel MOS transistor Q4, and an output control circuit composed of an N-channel MOS transistor Q10, a P-channel MOS transistor Q9 and an inverter 3. The MOS transistors Q1 and Q2 are connected in series and the MOS transistors Q1 and Q2 are connected to a higher potential power supply line 4 and the ground potential line, respectively. The gates of the MOS transistors Q1 and Q2 are commonly connected to an external input terminal 1. The MOS transistors Q4 and Q3 are connected in series. The gates of the MOS transistors Q4 and Q3 are commonly connected to receive a signal and a connection node between the drains of the MOS transistors is connected to an external output terminal 2. The MOS transistor Q9 is connected between the higher potential power supply line 4 and the source of the MOS transistor Q4, and the MOS transistor Q10 is connected between the ground potential and the source of the MOS transistor Q3. The gate of the MOS transistor Q10 is supplied with a diagnosis signal from the diagnostic circuit 21. Also, the diagnosis signal is supplied to the gate of the MOS transistor Q9 via the inverter 3.

Figure 6:
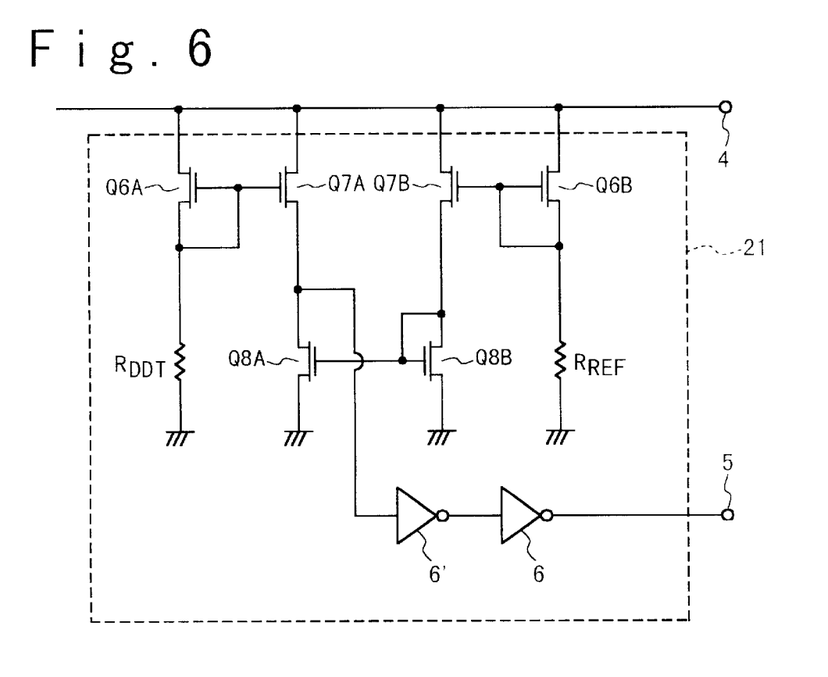
FIG. 6 is a circuit diagram illustrating the structure of a diagnostic circuit shown in FIG. 5.

The diagnostic circuit 21 includes a diagnostic resistor $R_{DDT}$ and a reference resistor $R_{REF}$. The diagnostic circuit 21 is composed of a section for an upper limit diagnosis and a section for a lower limit diagnosis, which are both same in the structure except for the resistance value. FIG. 6 is a circuit diagram illustrating the structure of one of the sections in an example of the diagnostic circuit 21. Referring to FIG. 6, the diagnostic circuit 21 is composed of three current mirror circuits. The first current mirror circuit is composed of MOS transistor Q6A and Q7A, the second current mirror circuit is composed of MOS transistors Q6B and Q7B, and the third current mirror circuit is composed of the Q8A and Q8B. The diagnostic resistor $R_{DDT}$ is connected to the MOS transistor Q6A in the first current mirror circuit and the reference resistor $R_{REF}$ is connected to the MOS transistor Q6B in the second current irror circuit. The MOS transistors Q7A and Q7B are connected to the MOS transistors Q8A and Q8B, respectively. An output connection node between the MOS transistors Q7A and Q8A is connected to inverters 6' and 6 which are connected in series. The output of the inverter 6 is connected to the terminal 5 and the diagnosis signal is supplied to the signal processing circuit 10 via the terminal 5.

The signal processing circuit 10 inputs a logic signal from the external input terminal 1 by the input circuit section and processes the signal. The signal processing circuit 10 outputs the processed signal to the gates of the MOS transistors Q4 and Q3 of the output circuit. The diagnostic circuit 21 diagnoses or evaluates the gate lengths of MOS transistors Q1, Q2, Q3 and Q4 which are used in the signal processing circuit 10, based on the resistance value of the diagnostic resistor $R_{DDT}$ to generate the binary diagnosis signal. That is, the diagnostic circuit 21 generates the diagnosis signal of a low level when the resistance value of the diagnostic resistor $R_{DDT}$ is smaller than that of the reference resistor $R_{REF}$ and the diagnosis signal of a high level when the resistance value of the diagnostic resistor $R_{DDT}$ is equal to or larger than that of the reference resistor $R_{REF}$. The diagnosis signal is supplied from an output terminal 5 to the output control circuit of the signal processing circuit 10 such that the output terminal 2 is set to either of a signal output enable state and a signal output disabled state. More particularly, when the diagnosis signal is in the low level, the MOS transistors Q9 and Q10 are turned off such that the output terminal 2 is set to the high impedance state. Alternatively, the output terminal may be fixed to a predetermined potential level. On the other hand, when the diagnosis signal is in the high level, the MOS transistors Q9 and Q10 are turned on, the processed signal which is supplied to the gates of the MOS transistors Q3 and Q4 is inverted and outputted to the output terminal 2. In this manner, the state of the external output terminal 2 is controlled based on the diagnosis signal from the diagnostic circuit 20.

Absolute values of the deviation of element size from design values in manufacturing process could be the same within a small area or chip of a wafer on which the semiconductor integrated circuit devices are formed. Therefore, if the gate electrodes of the MOS transistors Q1 to Q4 in the signal processing circuit 10 and the diagnostic and reference resistors $R_{DDT}$ and $R_{REF}$ in the diagnostic circuit 21 are formed in the same manufacturing process, the gate electrodes would undergo the same deviation from the design values as the resistors $R_{DDT}$ and $R_{REF}$ undergo the deviation of width from the design values. For example, it is assumed that the diagnostic resistor has the width of 0.5 $\mu$m and the length of 10 $\mu$m and the reference resistor has the width of 5 $\mu$m and the length of 100 $\mu$m. Therefore, the diagnostic resistor and the reference resistor have the same resistance value. In this case, if the elements such as the MOS transistors and the resistors in the same chip are formed to be smaller by 0.05 μm in the gate lengths of the MOS transistors and the widths of the resistors than the design values, the resistance value of the diagnostic resistor R$_{DDT}$ becomes larger by 11%. On the other hand, the resistance value of the reference resistor becomes larger only by 1%. Therefore, whether the MOS transistors Q1 to Q4 as diagnosis target elements are formed to have desired characteristics can be determined by diagnosing whether the diagnostic resistor R$_{DDT}$ is formed to have a desired characteristic using the reference resistor R$_{REF}$ as a reference element, because the reference resistor is not influenced so much by change of parameters in the manufacturing process.

As described above, the signal processing circuit 10 has the same structure as that of the signal processing circuit 10 in the conventional semiconductor integrated circuit device shown in FIG. 2. In the first embodiment, the structure of the diagnostic circuit 21 is different from the diagnostic circuit 20 shown in FIG. 3. That is, in the conventional semiconductor integrated circuit device shown in FIG. 3, the diagnostic transistor Q$_{DDT}$ and the reference transistor Q$_{REF}$ are compared to each other in transistor characteristics. On the other hand, in the first embodiment, the diagnostic resistor R$_{DDT}$ and the reference resistor R$_{REF}$ are compared to each other, and the same effect can be obtained.

Next, the operation of the diagnostic circuit 21 will be described with reference to FIG. 6. The diagnostic circuit 21 functions as a comparing circuit and is composed of the transistors Q6A, Q6B, Q7A, Q7B, Q8A and Q8B. The width of the diagnostic resistor R$_{DDT}$ is designed to have the identical size with the gate lengths of the MOS transistors Q1 to Q4 in the signal processing circuit 10. Thereby, it is guaranteed that the change of the width of the diagnostic resistor R$_{DDT}$ due to change of the parameters in the manufacturing process is substantially the same as the change of the gate lengths of the MOS transistors Q1 to Q4 in the manufacturing process. On the other hand, the width of the reference resistor R$_{REF}$ is designed to be sufficiently larger than the width of the diagnostic resistor R$_{DDT}$ such that the change of the resistance value due to the change of the parameters in the manufacturing process can be ignored. The diagnostic resistor R$_{DDT}$ and the reference resistor R$_{REF}$ are formed in the same process as the gate electrodes of the MOS transistors Q1 to Q4 in the signal processing circuit 10 are formed. More particularly, for example, the polysilicon with phosphor ions added is used as the material of the resistors. The photo-lithography process and the etching process are executed to determine the element size after the processes of forming the gate electrode.

Figure 7:
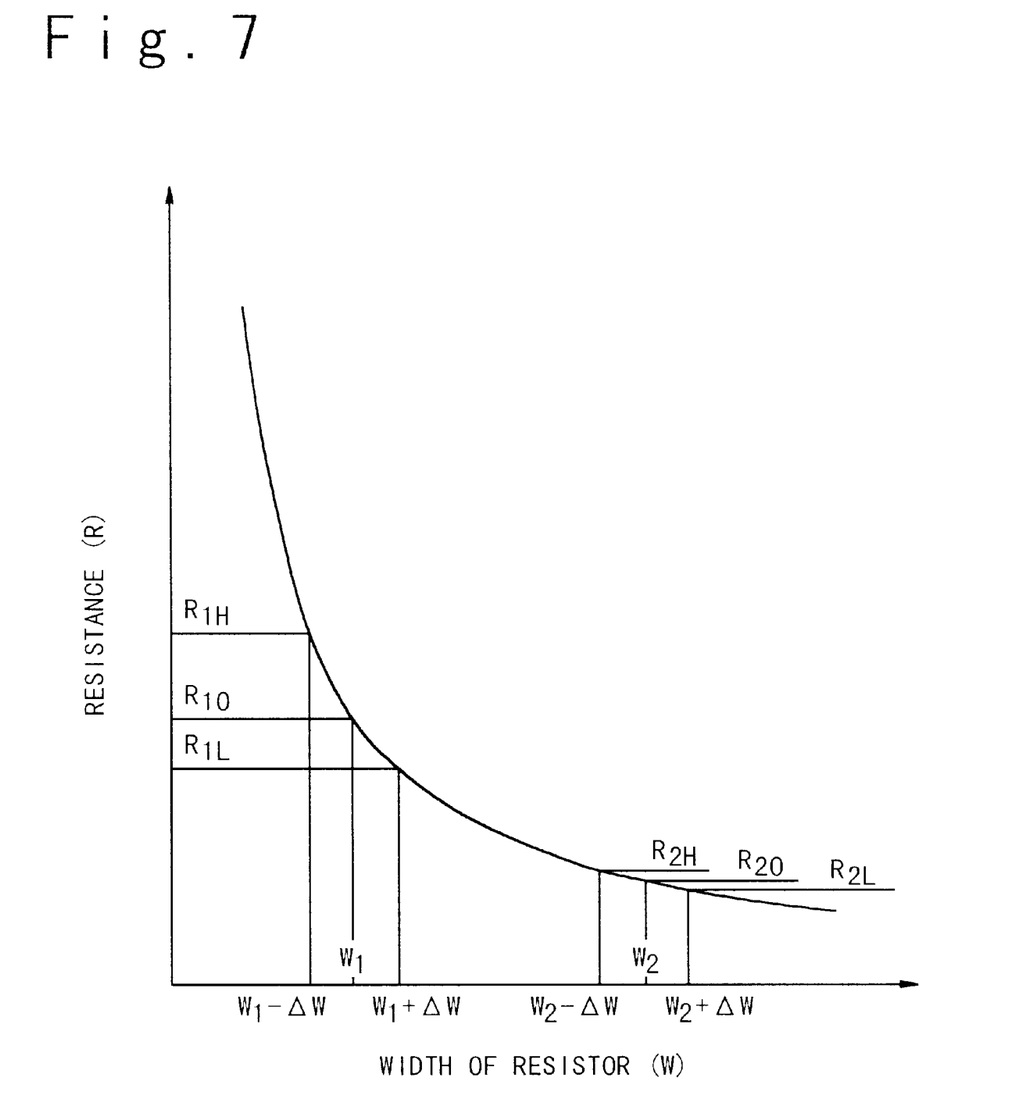
FIG. 7 is a graph illustrating a relation of resistance and width of a resistor.
Figures 9A, 9B, 9C:
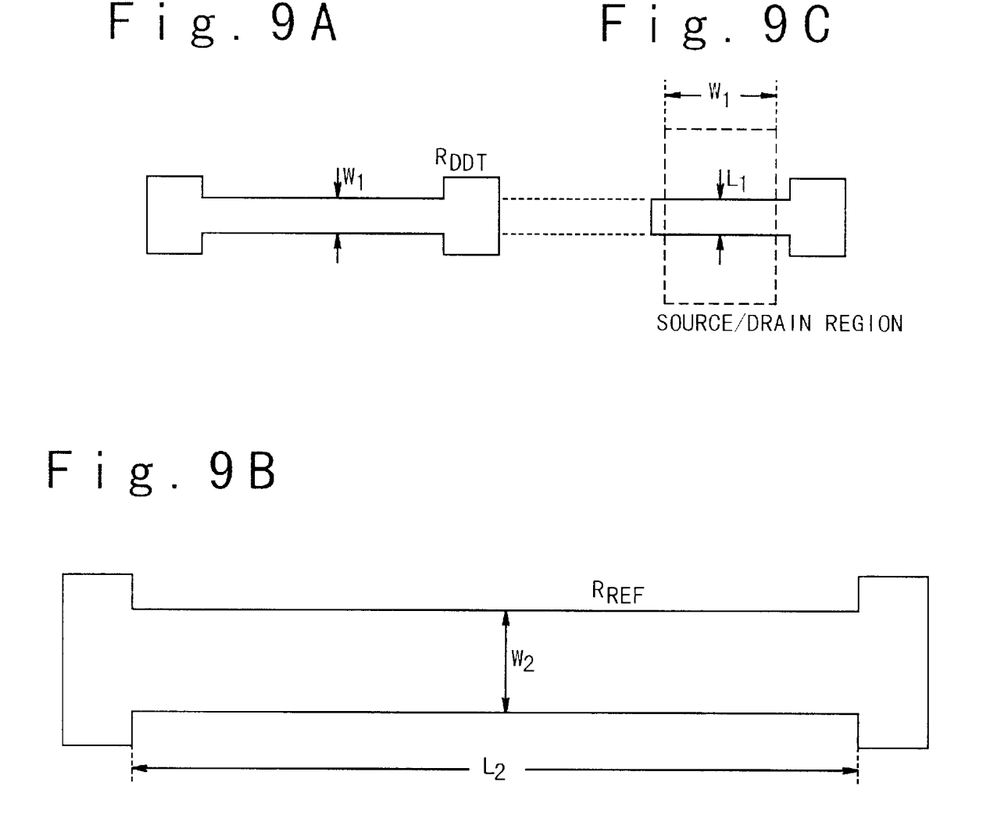
FIGS. 9A to 9D are plan views of resistors $R_{DDT}$ and $R_{REF}$ and MOS transistors Q1 and Q8A, respectively.

FIG. 7 shows a diagram illustrating the change of the resistance values of the diagnostic resistor R$_{DDT}$ and the reference resistor R$_{REF}$ due to change of the parameters in the manufacturing process. In FIG. 7, the abscissa indicates resistor width and the ordinate indicates resistance value. It is assumed that the width of the diagnostic resistor R$_{DDT}$ is W1, the width of the reference resistor R$_{REF}$ is W2 (W2>>W1), and the deviation of the width in the manufacturing process is ΔW. The resistance value R of the resistor which is formed in the semiconductor integrated circuit device is represented by the following equation (1).

$$R = \rho L / (W \times T) \quad (1)$$

where, ρ is the resistivity of the material, e.g., the polysilicon with phosphor ions added, L is the length of the resistor, W is the width of the resistor and T is the thickness of the resistor, as shown in FIGS. 9A and 9B. As would be apparent from the above equation (1), the resistance R is in inverse proportion to the width W of the resistor. That is, as shown in FIG. 7, under the influence of the same deviation of the width ΔW in the manufacturing process, the resistance value of the diagnostic resistor R$_{DDT}$ changes in a large range from R1L to R1H through R10, whereas the resistance value of the reference resistor R$_{REF}$ changes only in a small range from R2L to R2H through R20.

Referring to FIG. 6 again, the operation of the diagnostic circuit 21 will be described below. Here, like the conventional semiconductor integrated circuit device shown in FIG. 2, it is assumed that the gate length of each of the MOS transistors Q1 to Q4 in the signal processing circuit 10 and the width W1 of the diagnostic resistor RDDT are designed to be 0.5 μm, and the width W2 of the reference resistor R$_{REF}$ is designed to be 5.0 μm. In a case where the gate electrodes of the MOS transistors Q1 to Q4 and the resistors R$_{DDT}$ and R$_{RER}$ are formed to be smaller than the design values by 0.05 μm or above due to the change of the parameters in the manufacturing process, the diagnostic circuit 21 acting as the comparing circuit is designed to invert the output. That is, the diagnostic circuit 21 is designed such that the comparing circuit is set to a balance state when the width W1 of the diagnostic resistor R$_{DDT}$ is 0.45 μm and the width W2 of the reference resistor is 4.95 μm.

If the length L1 of the diagnostic resistor R$_{DDT}$ is designed to 10 μm, it is found that the length L2 of the reference resistor is to be set as represented by the following equation (2) because the resistivity ρ of the resistor and the thickness T are same.

$$L2 = (10/0.45) \times 4.95 = 110 \, \mu m \quad (2)$$

In the state in which any deviation of the resistance value in the manufacturing process is not present, the diagnostic resistor RDDT (W1=0.5 μm and L1=10 μm) has a resistance value of about 91% of the resistance value of the reference resistor R$_{REF}$ (W2=5.0 μm and L2=110 μm). Therefore, the drain current of the MOS transistor Q6A which is connected to the diagnostic resistor R$_{DDT}$ in series becomes larger than the drain current of the MOS transistor Q6B which is connected to the reference resistor R$_{REF}$ in series. In this case, the diagnosis signal having the high level is outputted to the terminal 5.

On the other hand, the deviation is generated in the manufacturing process so that the width is formed to be smaller than the design value by 0.05 μm or above, the relation of R$_{DDT}$>R$_{REF}$ is achieved so that the drain current of the transistor Q6A becomes smaller than the drain current of the transistor Q6B. Therefore, the signal level of the diagnosis signal on the terminal 5 is inverted. That is, the diagnosis signal having the low level is outputted to the terminal 5.

In the signal processing circuit 10, when the diagnosis signal is in the low level, the output control circuit composed of the MOS transistors Q9 and Q10 sets the output circuit composed of the MOS transistors Q3 and Q4 in the output disable state so that the output terminal 2 is set to the high impedance state. On the other hand, when the diagnosis signal is in the high level, the output control circuit sets the output circuit to the output enable state.

In the above conventional semiconductor integrated circuit device shown in FIG. 2, in order to compare the mutual conductances of the diagnostic and reference MOS transistors, the setting of circuit constants, i.e., the gate ength and gate width of the reference transistor Q$_{REF}$ is complicated. On the other hand, in the semiconductor integrated circuit device according to this embodiment, it is advantageous that the design values can be very simply found.

Figure 9D:
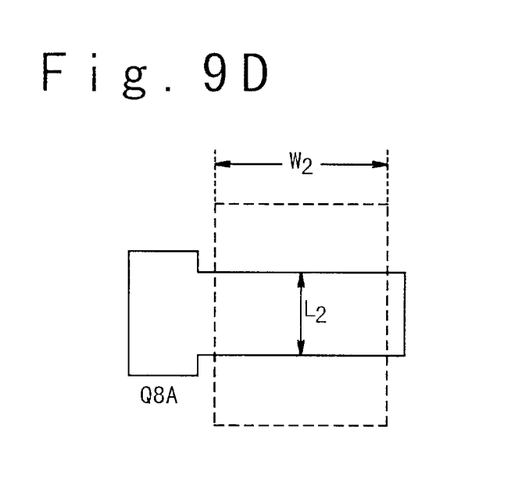

The mutual conductance gm of the MOS field effect transistor is represented by the following equation (3) in a primary approximation.

$$gm = K \times (W/L)(V_G - V_T)2 \qquad (3)$$

where, K is a constant, L is an effective gate length, W is an effective gate width, $V_G$ is an applied voltage to the gate electrode, and $V_T$ is a threshold voltage of the MOS transistor, as shown in FIGS. 9C and 9D.

The problem is in that because the threshold voltage VT has dependency on the gate length L, the mutual conductance of the diagnostic transistor $Q_{DDT}$ and the mutual conductance of the reference transistor $Q_{REF}$ are not same even if the gate length and gate width of the reference transistor $Q_{REF}$ are determined to have values larger predetermined times than the gate length and gate width of the diagnostic transistor $Q_{DDT}$, as shown in FIG. 3. Therefore, the reference transistor $Q_{REF}$ must be designed under consideration of the difference in threshold voltage VT between the diagnostic transistor $Q_{DDT}$ and the reference transistor $Q_{REF}$ and so on. Also, in the actual circuit design, since the fine adjustment of the device performance is necessary, the cut and try method needs to be executed after a provisional version is made.

As described above, in the present embodiment, the two resistors $R_{DDT}$ and $R_{REF}$ which have substantially the same ratio of the length to the width to have substantially the same resistance value are arranged in the comparing circuit of the diagnostic circuit 21. Therefore, utilizing that the length or width of the two resistors $R_{DDT}$ and $R_{REF}$ is changed by the same value due to the change of the parameters in the manufacturing process so that the resistance value of the diagnostic resistor $R_{DDT}$ which has the smaller length or width changes more than the resistance value of the resistor $R_{REF}$ which has the larger length or width, the change amount of the length or width of the resistor and the gate length of the MOS field effect transistor which indicates the same change as the resistor can be detected.

Note that it is preferable that the transistors Q6A, Q6B, Q7A, Q7B, Q8A and Q8B used in the diagnostic circuit 21 have the gate length which is equal to or more than 3.0 μm such that the deviation of the comparing circuit in characteristic can be reduced.

Also, in the present embodiment, the width of the reference resistor $R_{REF}$ is larger 10 times than the width of the diagnostic resistor $R_{DDT}$. However, this magnification should be determined based on the size of elements to be managed based on the manufacture standard and the deviation in the manufacture process. That is, in a case where the manufacture standard in the manufacturing process is equal to or less than 10%, the magnification is required to be preferably equal to or more than 3 times, and more preferably equal to or more than 5 times. Also, in a case where the manufacture standard in the manufacturing process is equal to or less than 7%, the magnification is required to equal to or more than 5 times.

Figure 8:
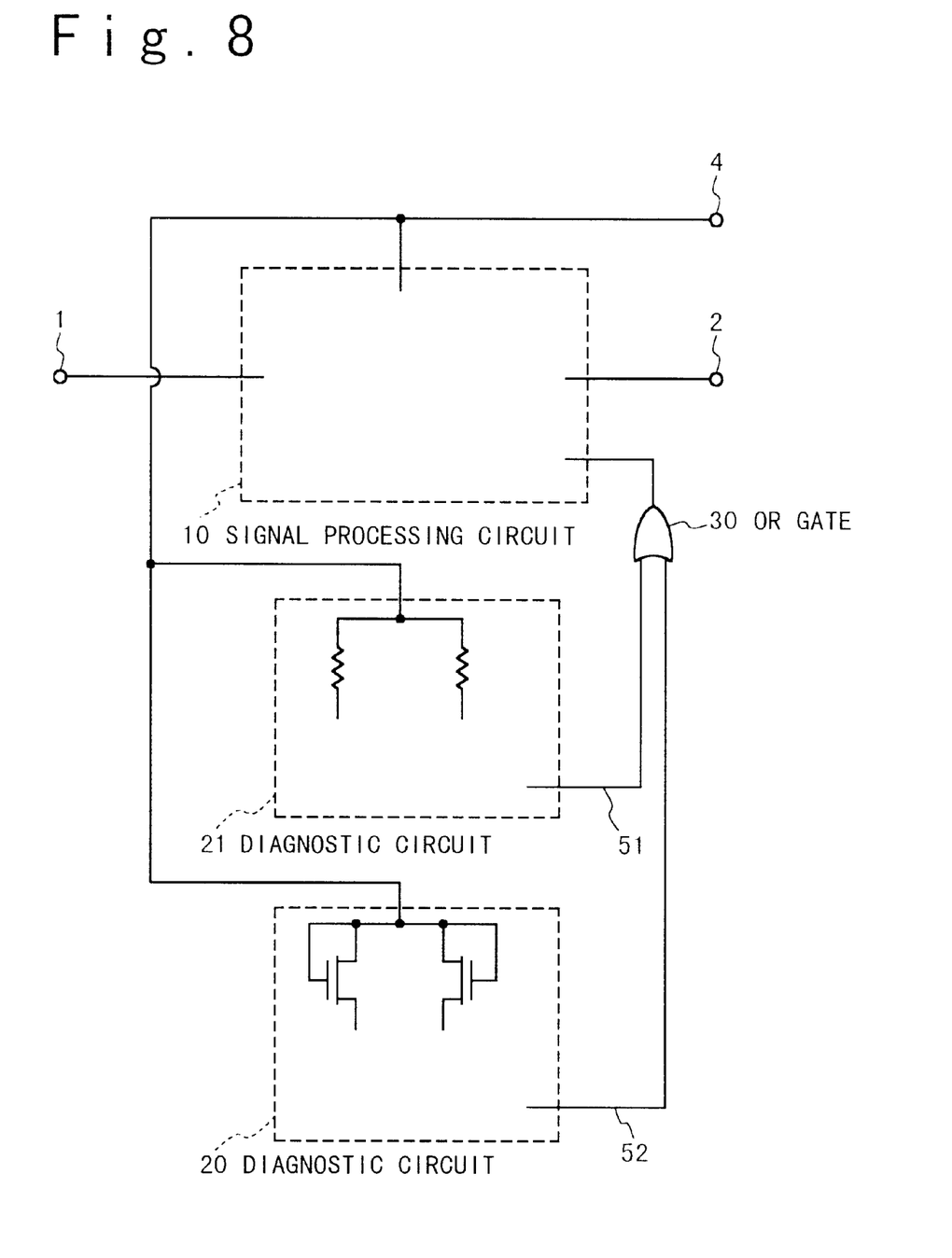
FIG. 8 is a block diagram illustrating a semiconductor integrated circuit device according to the second embodiment of the present invention.

Next, the semiconductor integrated circuit device according to the second embodiment of the present invention will be described. FIG. 8 is a block diagram illustrating the structure of the semiconductor integrated circuit device in the second embodiment. In FIG. 8, the signal processing circuit 10 and the diagnostic circuit 21 have the same structures as those of the first embodiment shown in FIGS. 5 and 6. In this embodiment, the conventional diagnostic circuit 20 which compares the mutual conductances of the MOS transistors shown in FIG. 3 is further added. A diagnosis signal generated at an output terminal 51 of the diagnostic circuit 21 and the diagnosis signal generated at an output terminal 52 of the diagnostic circuit 20 are inputted to an OR circuit 30 and a new diagnosis signal indicative of logical OR of the two diagnosis signals is outputted to the signal processing circuit 10 and the output circuit of the circuit 10 is controlled by the output control circuit based on the new diagnosis signal from the OR circuit 30.

In this embodiment, the conventional diagnostic circuit 20 which diagnoses the drain current of the diagnostic MOS field effect transistor and the diagnostic circuit 21 which diagnoses the resistance value of the diagnostic resistor which is formed at the same time as the MOS transistors are both used. The diagnostic circuit 21 detects that the gate length is outside of the manufacture standard. The diagnostic circuit 20 detects the change of the mutual conductance of the MOS transistor due to change of a gate oxidation film thickness, change of an impurity addition quantity and so on.

The characteristics of the MOS field effect transistor such as the threshold voltage and the mutual conductance change due to change of the parameters in the manufacturing process. The change of the gate length influences the most to the change of the transistor characteristics. In addition, the change of the thickness of the gate insulating film and the doping amount of impurity ions injected into the gate region for controlling the threshold voltage are also important. In the present embodiment, therefore, the gate length outside of the manufacture standard is detected by the diagnostic circuit 20 and the diagnostic circuit 21. In addition, it is made possible to detect by the diagnostic circuit 20 as the change of the mutual conductance that the thickness of the gate insulating film and the doping amount of impurity ions are outside of the manufacture standards. That is, in the present embodiment, it is possible to improve the reliability of the circuit operation, compared to the said first embodiment.

In the above description, only one signal is inputted to the signal processing circuit 10. However, a plurality of input signals may be inputted. Also, one diagnostic circuit is provided for determination relating to the lower limit value. However, two diagnostic circuits may be provided for the determination relating to the upper and lower limit values. Further, the signal processing circuit 10 includes the output control circuit composed of the MOS transistors Q9 and Q10. However, another circuit may be provided which is controlled by the diagnosis signal such that the output of the signal processing circuit is set to either of the output enable/disable states.

Figure 10:
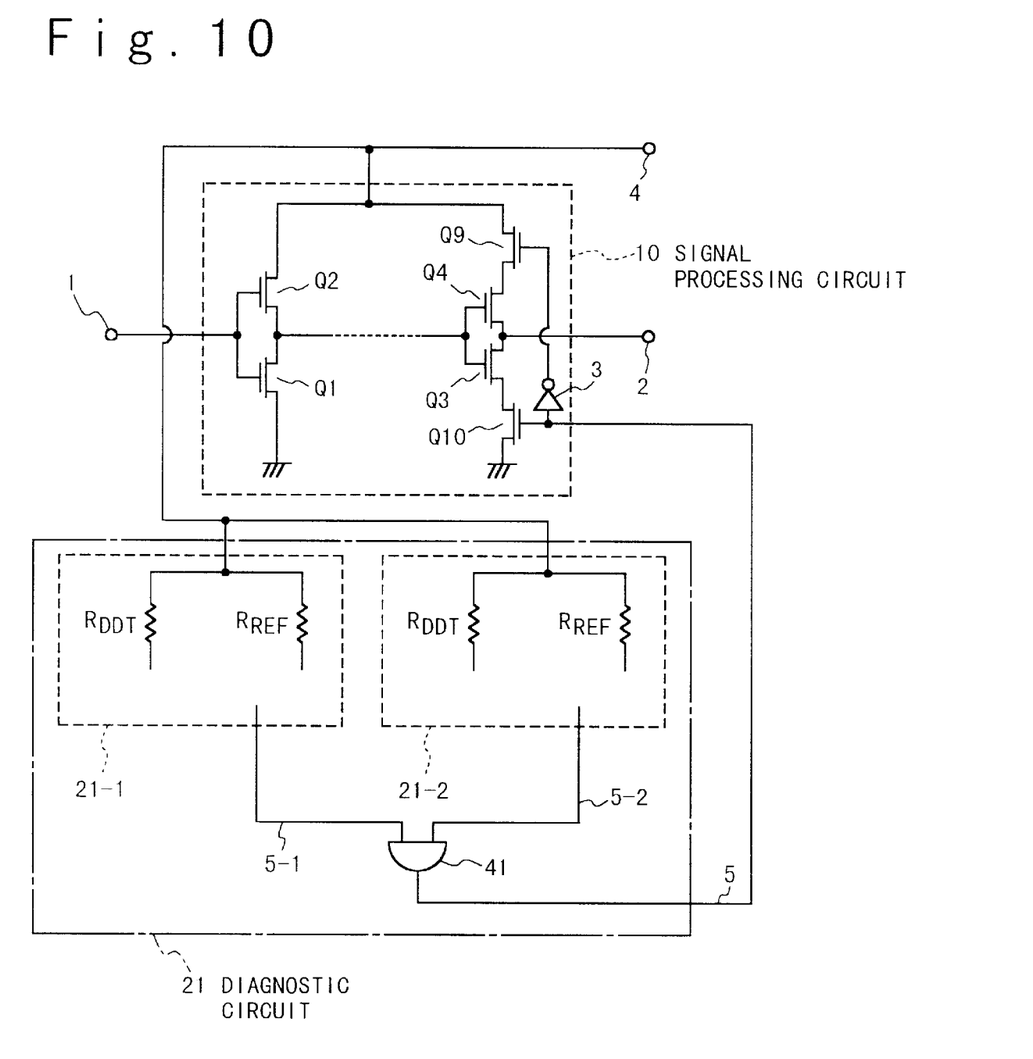
FIG. 10 is a block diagram illustrating a semiconductor integrated circuit device according to the third embodiment of the present invention.
Figure 11:
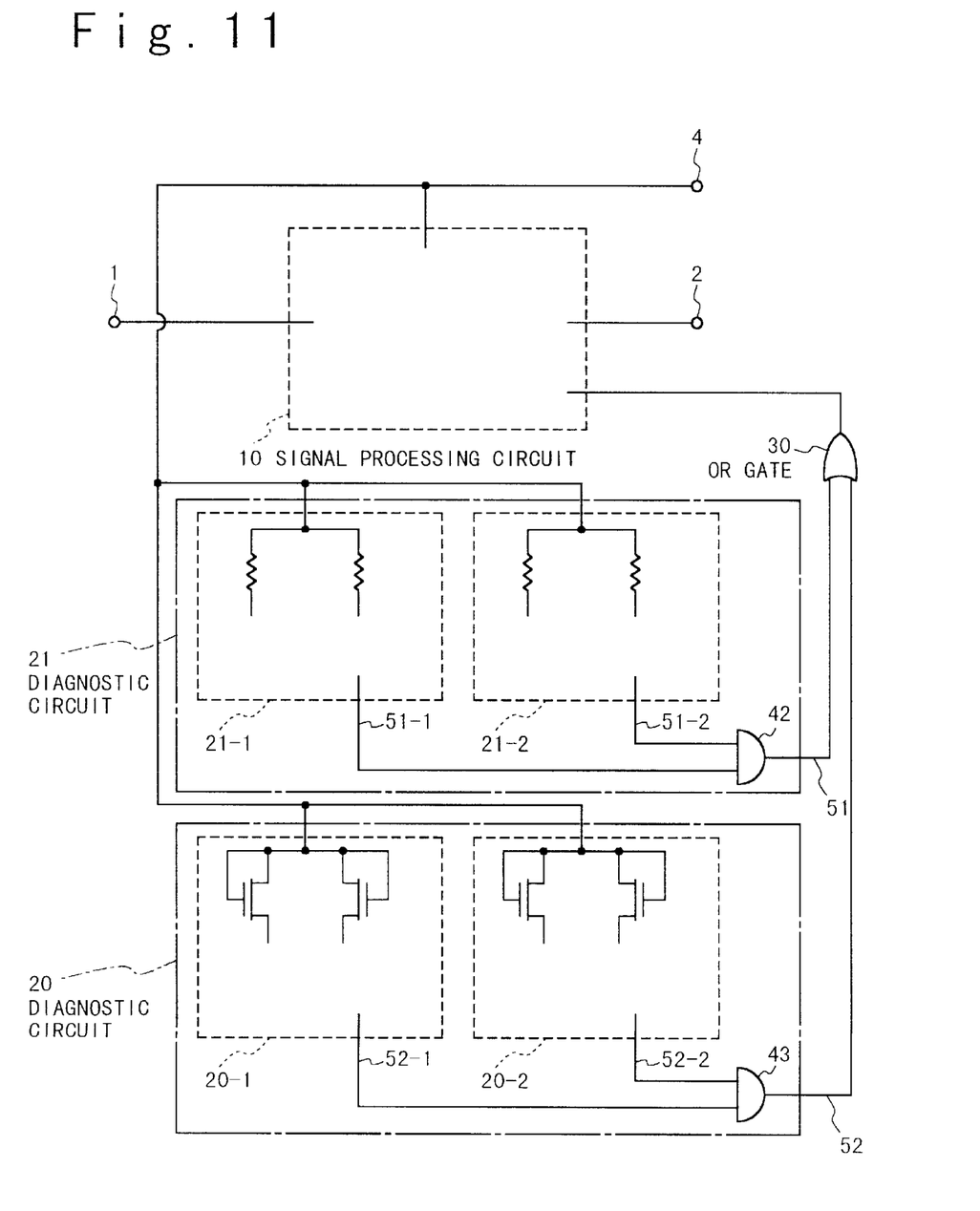
FIG. 11 is a block diagram illustrating a semiconductor integrated circuit device according to the fourth embodiment of the present invention.

In the first and second embodiments shown in FIGS. 5 and 8, only one of the upper limit and the lower limit is diagnosed. As shown in FIG. 10, the diagnostic circuit in the third embodiment is provided in which each of circuit sections 21-1 and 21-2 is the same as diagnostic circuit 21 shown in FIG. 5, except for resistance values $R_{DDT}$ and $R_{REF}$. The resistance values of the circuit section 21-1 are for an upper limit resistance value and the resistance values of the circuit section 21-2 are for a lower limit resistance value. A logical AND of the output signals 5-1 and 5-2 from the circuit sections 21-1 and 21-2 is calculated by an AND gate 41 and supplied to the signal processing circuit. In FIG. 11, like the second embodiment shown in FIG. 8, there is further provided in the semiconductor integrated circuit of the fourth embodiment, a diagnostic circuit 20 composed of circuit portions 20-1 and 20-2 each of which is the same as the diagnostic circuit 20 shown in FIG. 2 except for conductances. The circuit portions 20-1 and 20-2 are provided for the upper limit and lower limit, respectively. A logical AND of the output signals 52-1 and 52-2 from the 25 circuit sections 20-1 and 20-2 is calculated by an AND gate 43 and supplied to the NOR gate 30, like the second embodiment described above. Also, the diagnostic circuit 20 is similar to that of FIG. 10.

As described above, in the present invention, the diagnostic circuit composed of the comparing circuit for self-diagnosing the gate length of the MOS field effect transistors is provided in the semiconductor integrated circuit device. Also, the state of the output terminal of the semiconductor integrated circuit device is controlled based on the diagnosing result such that the output is enabled or disabled. Therefore, the evaluation of the semiconductor integrated circuit device is made easy so that the production cost of the semiconductor integrated circuit device can be reduced. This is because the semiconductor integrated circuit device according to the present invention does not need expensive evaluation facilities such as an analog tester and a usual digital tester can be used.

Also, it is not necessary to increase the number of input/output pins of the semiconductor integrated circuit device. This depends on the use of the structure in which the output enable/disable state on the output terminal of the semiconductor integrated circuit device is determined based on the diagnosis result.

Further, the manufacture standard can be easily reflected to the circuit element size so that the required development period of the semiconductor integrated circuit device can be reduced. In the present invention, this is because the change of the gate length can be detected as the change of the length of the resistor and therefore the monitoring of the change of the resistance value of the resistor is sufficient to detect the change of the gate length.

What is claimed is:

1. A semiconductor integrated circuit device comprising:
a signal processing circuit including an input circuit for inputting a circuit signal and an output control circuit for processing the circuit signal, wherein said signal processing circuit includes a plurality of metal oxide semiconductor (MOS) transistors, said output control circuit outputs the processed signal to an output terminal, and said output control circuit sets said output control circuit to one of an output enable state and an output disable state based on a diagnosis signal; and
a diagnostic circuit including at least a diagnostic resistor indicative of a gate length of each of the plurality of MOS transistors, for outputting said diagnosis signal to said signal processing circuit based on a resistance value of said diagnostic resistor.

2. A semiconductor integrated circuit device according to claim 1, wherein said diagnostic resistor has a width corresponding to a gate length of said each of said plurality of MOS transistors such that a change of said diagnostic resistor in resistance value represents change of said each of said plurality of MOS transistors in gate length.

3. A semiconductor integrated circuit device according to claim 1, wherein said diagnostic circuit further includes a reference resistor, and generates said diagnosis signal based on whether said diagnostic resistor has the resistance value larger than that of said reference resistor or whether said diagnostic resistor has the resistance value smaller than that of said reference resistor.

4. A semiconductor integrated circuit device according to claim 3, wherein said diagnostic resistor has a width corresponding to the gate length of said each of said plurality of MOS transistors such that change of said diagnostic resistor in resistance value represents change of said each of said plurality of MOS transistors in gate length.

5. A semiconductor integrated circuit device according to claim 4, wherein said reference resistor has the width at least three times larger than the gate length of said each of said plurality of MOS transistors.

6. A semiconductor integrated circuit device according to claim 3, wherein an amount of deviation of the resistance value of said diagnostic resistor because of a manufacturing process is larger than an amount of deviation of the resistance value said reference resistor because of the manufacturing process.

7. A semiconductor integrated circuit device according to claim 3, wherein said diagnostic circuit includes three current mirror circuits for comparing the resistance value of said diagnostic resistor and the resistance value of said reference resistor, and each of MOS transistors in said current mirror circuits has a gate length longer than 3.0 $\mu$m.

8. A semiconductor integrated circuit device comprising:
a signal processing circuit including an input control circuit for inputting a circuit signal, and an output control circuit for processing the circuit signal, wherein said signal processing circuit includes a plurality of metal oxide semiconductor (MOS) transistors, said output control circuit outputs the processed signal to an output terminal, and said output control circuit sets said output control circuit to one of an output enable state and an output disable state based on one of a first and second diagnosis signal;
a first diagnostic circuit including at least a diagnostic resistor indicative of a gate length of each of the plurality of MOS transistors, for generating said first diagnosis signal based on a resistance value of said diagnostic resistor;
a second diagnostic circuit including at least a diagnostic MOS transistor corresponding to each of the plurality of MOS transistors, for generating said second diagnosis signal based on a mutual conductance of said diagnostic MOS transistor.

9. A semiconductor integrated circuit device according to claim 8, wherein said first diagnostic resistor has a width corresponding to gate lengths of each of said MOS transistors such that change of said diagnostic resistor in resistance value represents change of said gate lengths.

10. A semiconductor integrated circuit device according to claim 8, wherein said first diagnostic circuit further includes a reference resistor, and generates said first diagnosis signal based on whether said diagnostic resistor has the resistance value larger than that of said reference resistor or whether said diagnostic resistor has the resistance value smaller than that of said reference resistor.

11. A semiconductor integrated circuit device according to claim 10, wherein said diagnostic resistor has a width corresponding to the gate length of each of said MOS transistors such that change of said diagnostic resistor in resistance value represents change of gate length in each of said MOS transistors.

12. A semiconductor integrated circuit device according to claim 11, wherein said reference resistor has the width at least three times larger than the gate length of each of said MOS transistors.

13. A semiconductor integrated circuit device according to claim 10, wherein an amount of deviation of the resistance value of said diagnostic resistor because of a manufacturing process is larger than an amount of deviation of the resistance value of said reference resistor because of the manufacturing process.

14. A semiconductor integrated circuit device according to claim 10, wherein said first diagnostic circuit includes three current mirror circuits for comparing the resistance value of said diagnostic resistor and the resistance value of said reference resistor, and each of MOS transistors in said current mirror circuits has a gate length longer than 3.0 μm.

15. A method of diagnosing a semiconductor integrated circuit device, comprising the steps of:

forming a diagnostic resistor and gate electrodes of a plurality of MOS transistors at same time, said diagnostic resistor being indicative of a gate length of said gate electrodes of the plurality of MOS transistors;

generating a diagnosis signal based on a resistance value of said diagnostic resistor;

controlling an output of a signal processing circuit to one of an output enable state and an output disable state based on said diagnosis signal.

16. A method according to claim 15, wherein said forming step includes forming said diagnostic resistor to have a width corresponding to gate lengths of said plurality of MOS transistors such that change of said diagnostic resistor in resistance value represents change of said plurality of MOS transistors in gate length.

17. A method according to claim 15, further comprising the step of forming a reference resistor at a same time as said diagnostic resistor, and wherein said generating step includes generating said diagnosis signal based on whether said diagnostic resistor has the resistance value larger than that of said reference resistor.

18. A method according to claim 17, wherein said forming step includes forming said diagnostic resistor to have a width corresponding to the gate length of said each MOS transistor such that change of said diagnostic resistor in resistance value represents change of said plurality of MOS transistors in gate length.

19. A method according to claim 18, wherein said reference resistor has the width at least three time larger than the gate lengths of said plurality of MOS transistors.

20. A method according to claim 17, wherein an amount of deviation of the resistance value of said diagnostic resistor because of a manufacturing process is further larger than of an amount of deviation of the resistance value of said reference resistor because of the manufacturing process.

* * * * *